United States Patent
Wen

(10) Patent No.: US 10,217,814 B2
(45) Date of Patent: Feb. 26, 2019

(54) SEMICONDUCTOR DEVICE

(71) Applicant: Nuvoton Technology Corporation, Hsinchu (TW)

(72) Inventor: Wen-Ying Wen, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/856,066

(22) Filed: Dec. 28, 2017

(65) Prior Publication Data

US 2018/0190764 A1     Jul. 5, 2018

(30) Foreign Application Priority Data

Dec. 29, 2016   (TW) .............................. 105143896 A

(51) Int. Cl.
| | |
|---|---|
| H01L 29/66 | (2006.01) |
| H01L 29/06 | (2006.01) |
| H01L 29/10 | (2006.01) |
| H01L 29/78 | (2006.01) |

(52) U.S. Cl.
CPC ...... H01L 29/0634 (2013.01); H01L 29/0653 (2013.01); H01L 29/1095 (2013.01); H01L 29/7816 (2013.01)

(58) Field of Classification Search
USPC ........ 257/E29.197, 272, 256, 341, 343, 504, 257/E29.148–E29.149, E29.265, E29.32, 257/339, 48
See application file for complete search history.

(56) References Cited

U.S. PATENT DOCUMENTS

| | | | |
|---|---|---|---|
| 6,528,849 B1 * | 3/2003 | Khemka | ............. H01L 29/0634 257/335 |
| 8,373,227 B2 | 2/2013 | Sonsky et al. | |
| 2002/0050613 A1 * | 5/2002 | Rumennik | .......... H01L 29/0619 257/325 |

FOREIGN PATENT DOCUMENTS

| | | |
|---|---|---|
| TW | 201011913 | 3/2010 |
| TW | 201103147 | 1/2011 |

OTHER PUBLICATIONS

"Office Action of Taiwan Counterpart Application," dated Apr. 17, 2017, p. 1-p. 4, in which the listed references were cited.

* cited by examiner

*Primary Examiner* — Niki H Nguyen
(74) *Attorney, Agent, or Firm* — JCIPRNET

(57) ABSTRACT

A semiconductor device including a substrate, a metal-oxide-semiconductor field-effect transistor (MOSFET), and a plurality of junction gate field-effect transistors (JFETs) connected in parallel is provided. The MOSFET is disposed on a substrate. The MOSFET includes a source region, a drain region, and a gate structure disposed between the source region and the drain region. The JFETs and the MOSFET are connected in series. Each of the JFETs laterally extends between the source region and the drain region.

9 Claims, 2 Drawing Sheets

US 10,217,814 B2

SEMICONDUCTOR DEVICE

CROSS-REFERENCE TO RELATED APPLICATION

This application claims the priority benefit of Taiwan application serial no. 105143896, filed on Dec. 29, 2016. The entirety of the above-mentioned patent application is hereby incorporated by reference herein and made a part of this specification.

FIELD OF THE INVENTION

The invention relates to an integrated circuit. More particularly, the invention relates to a semiconductor device.

DESCRIPTION OF RELATED ART

In recent years, along with the rise of awareness of environmental protection, high voltage devices with low power consumption and high efficiency of energy conversion attract more and more attention. Generally, the high voltage devices are mainly applied in power switch devices, such as in the fields of switching mode power supply (SMPS), illumination, motor control, or plasma display panel drivers.

A laterally diffused metal oxide semiconductor (LDMOS) device is a typical high voltage device, and the process of fabricating the same can be integrated with the process of fabricating complementary metal oxide semiconductor to fabricate a device for control, logic, and turning-on/off functions on a single chip. The LDMOS device must have operating characteristics of a high breakdown voltage and a low on-state resistance (Ron). Nevertheless, if a designer intends to meet the specification requirements for the high breakdown voltage, the Ron is usually sacrificed, and vice versa. Hence, the relationship between the high breakdown voltage and the Ron is a trade-off.

SUMMARY OF THE INVENTION

The invention provides a semiconductor device for connecting a plurality of junction gate field-effect transistors (JFETs) connected in parallel with a metal-oxide-semiconductor field-effect transistor (MOSFET) in series, such that the semiconductor device is equipped with a high breakdown voltage and at the same time is able to maintain a low on-state resistance (Ron).

In an embodiment of the invention, the semiconductor device includes a substrate, the MOSFET, and a plurality of JFETs connected in parallel. The MOSFET is disposed on the substrate. The MOSFET includes a source region, a drain region, and a gate structure disposed between the source region and the drain region. The JFETs and the MOSFET are connected in series. Each of the JFETs laterally extends between the source region and the drain region.

In an embodiment of the invention, a semiconductor device includes a substrate of a first conductivity type, a source region of a second conductivity type, a drain region of the second conductivity type, a gate structure, a first drift region of the second conductivity type, a plurality of first isolation structures, and a plurality of first doped regions of the first conductivity type. The source region and drain region are respectively disposed on the substrate. The gate structure is disposed on the substrate between the source region and the drain region. The first drift region is disposed between the substrate and the gate structure. The first isolation structures are respectively disposed in the first drift region, such that the first drift region is divided into a plurality of second drift regions. Each of the second drift regions laterally extends between the source region and the drain region. The first doped regions are respectively disposed between the first isolation structures and the second drift regions.

In view of the forgoing, in the embodiments of the invention, a plurality of JFETs connected in parallel are connected with the MOSFET in series. When a drain voltage is low, the Ron of the semiconductor device provided in the embodiments of the invention acts as a parallel resistance of the JFETs. But when the drain voltage is high, since a pinch-off effect in the JFETs shares most of the voltage drop, the breakdown voltage of the semiconductor device provided in the embodiments of the invention is increased. It is thus can be seen that the semiconductor device provided in the embodiments of the invention is not only equipped with a high breakdown voltage but also able to maintain a low Ron at the same time.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
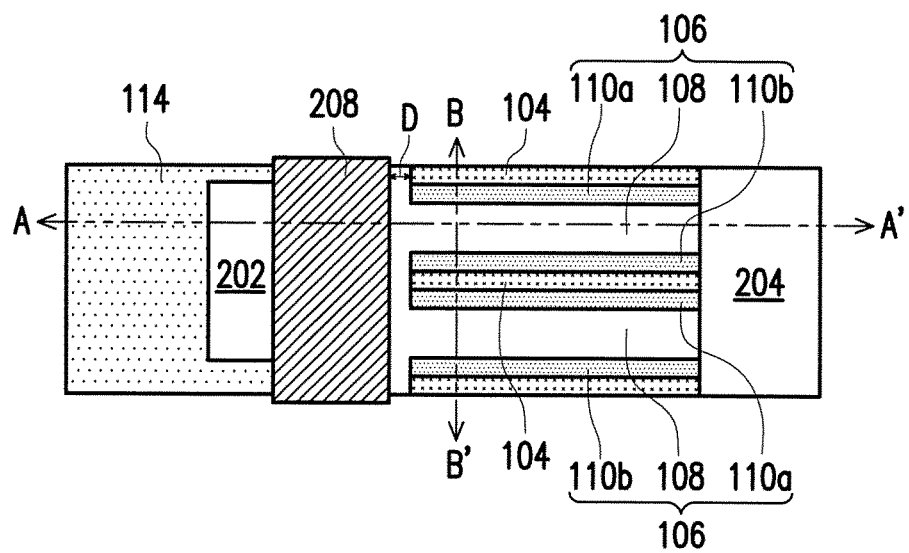
FIG. 1 is a top view of a semiconductor device according to an embodiment of the invention.

Example embodiments will now be described more fully with reference to the accompanying drawings. Example embodiments may, however, be embodied in many different forms and should not be construed as being limited to the embodiments set forth herein. In the drawings, thicknesses of layers and regions are exaggerated for clarity purpose. Wherever possible, the same reference numbers are used in the drawings and the description to refer to the same or like parts. Therefore, detailed description thereof will not be described herein.

In the embodiments of the invention, a first conductivity type and a second conductivity type are different. In an embodiment, the first conductive type is N type, and the second conductive type is P type. In another embodiment, the first conductive type is P type, and the second conductive type is N type. A P-type dopant is boron, for example, and an N-type dopant is phosphorus or arsenic, for example. In the embodiment, the first conductivity type is exemplified as P-type and the second conductivity type is exemplified as N-type for description. But the invention is not limited thereto.

FIG. 1 is a top view of a semiconductor device according to an embodiment of the invention. For clarity of the drawings, only a source region, a drain region, a gate structure, a well region, first isolation structures, and JFETs are illustrated in FIG. 1.

Referring to FIG. 1, a semiconductor device 10 includes a source region 202 of the second conductivity type, a drain region 204 of the second conductivity type, a gate structure 208, first isolation structures 104, and a plurality of JFETs 106 connected in parallel.

A MOSFET may be constituted by the source region 202, the drain region 204, and the gate structure 208 disposed between the source region 202 and the drain region 204. The MOSFET and the JFETs 106 are connected in series. As shown in FIG. 1, each of the JFETs 106 laterally extends between the source region 202 (or the gate structure 208) and the drain region 204. In other words, each of the JFETs 106 extends along a direction from the source region 202 (or the gate structure 208) toward the drain region 204 (i.e., the direction along the line A-A'). Specifically, each of the JFETs 106 includes two first doped regions 110a and 110b of the first conductivity type and a drift region 108 of the second conductivity type. The drift region 108 is located between the two first doped regions 110a and 110b in another direction (i.e., the direction along the line B-B') perpendicular to the direction from the source region 202 (or the gate structure 208) toward the drain region 204. The first isolation structures 104 are respectively disposed among the JFETs 106. In other words, each of the first isolation structures 104 also laterally extends between the source region 202 (or the gate structure 208) and the drain region 204. Moreover, the first isolation structures 104 and the JFETs 106 are alternately arranged along the direction of the line B-B'. In addition, although only two JFETs 106 are illustrated in FIG. 1, the invention is not limited thereto. In other embodiments, the number of the JFETs 106 may be adjusted as required.

In the embodiment, the JFETs 106 connected in parallel are separated by the first isolation structures 104, such that the number of channel between the source region 202 and the drain region 204 has increased from one channel to a plurality of channels (i.e., a plurality of drifting regions 108). Hence, when the drain voltage is low, a Ron of the semiconductor device 10 provided by the embodiment acts as a parallel resistance of the JFETs 106. But when the drain voltage is high, since a pinch-off effect in the JFETs 106 shares most of the voltage drop, a breakdown voltage of the semiconductor device 10 provided by the embodiment is increased. It is thus can be seen that the semiconductor device 10 provided by the embodiment is not only equipped with a high breakdown voltage but also at the same time able to maintain a low Ron.

Figure 2:
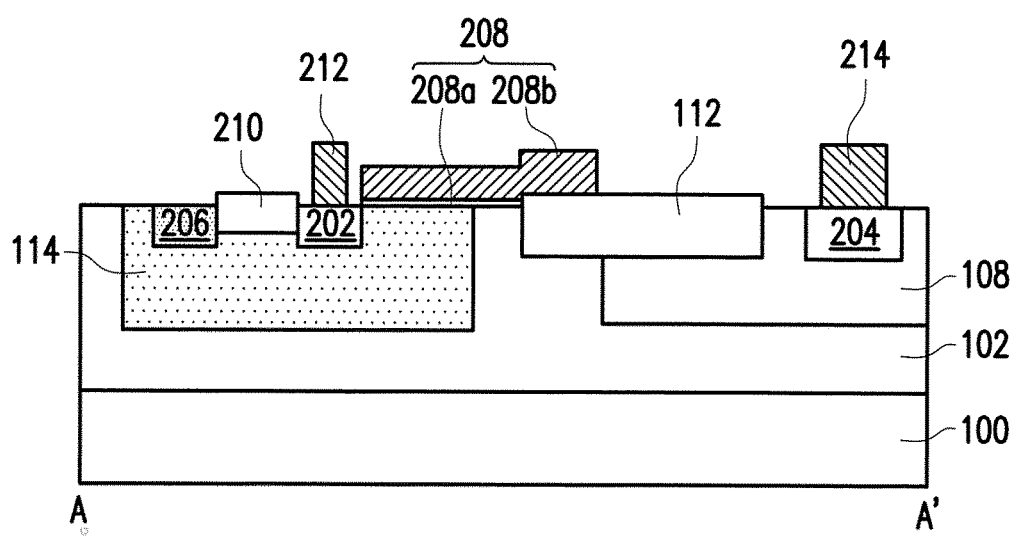
FIG. 2 is a schematic cross-sectional view of the first embodiment taken along the line A-A' in FIG. 1.

It is worth noting that, the first isolation structures 104 and the gate structure 208 provided by the embodiment are separated by a distance D in the direction along the line A-A'. Such that a gate dielectric layer 208a (as shown in FIG. 2) in the gate structure 208 and the first isolation structures 104 are not overlapped with one another owing to the distance D, and a time-dependent dielectric breakdown (TDDB) effect is therefore avoided, and the reliability of the semiconductor device 10 is further enhanced. In one embodiment, the distance D may be, for example, greater than or equal to 0 μm. But the invention is not limited thereto. In other embodiments, the distance between the first isolation structures 104 and the gate structure 208 may be close to zero. Alternately, the first isolation structures 104 and the gate structure 208 may be partially overlapped with one another.

Moreover, the semiconductor device 10 provided by the embodiment further includes a well region 114 of the first conductivity type. The well region 114 is located at a side of the gate structure 208 distant from the JFETs 106, such that the source region 202 is located between the well region 114 and the gate structure 208. Looking from another direction, the source region 202 is surrounded by the well region 114, and the well region 114 is connected to one portion of the gate structure 208.

Figure 3A:
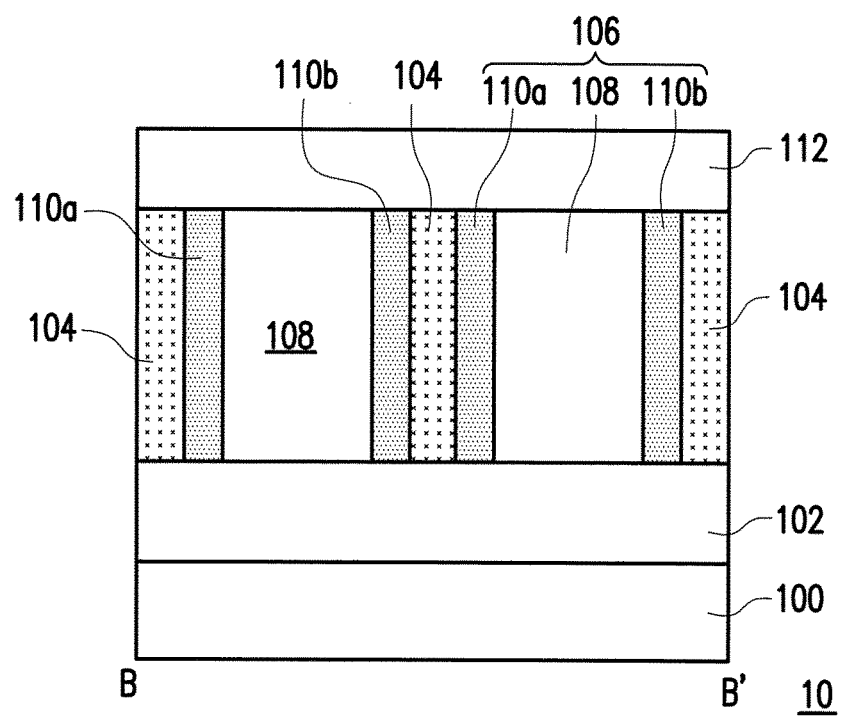
FIG. 3A is a schematic cross-sectional view of the first embodiment taken along the line B-B' in FIG. 1.

FIG. 2 is a schematic cross-sectional view of the first embodiment taken along the line A-A' in FIG. 1. FIG. 3A is a schematic cross-sectional view of the first embodiment taken along the line B-B' in FIG. 1.

Referring to FIG. 1, FIG. 2, and FIG. 3A, looking from a schematic cross-sectional view, the semiconductor device 10 includes the substrate 100 of the first conductivity type, a third doped region 102 of the second conductivity type, the well region 114 of the first conductivity type, the source region 202 of the second conductivity type, the drain region 204 of the second conductivity type, a fourth doped region 206 of the first conductivity type, the gate structure 208, the first isolation structures 104, a second isolation structure 112, and a plurality of JFETs 106 connected in parallel.

The substrate 100 may be a semiconductor substrate, a semiconductor compound substrate, or a semiconductor over insulator (SOI) substrate. The semiconductor is, for example, IVA group atoms, such as silicon or germanium. The semiconductor compound is, for example, formed of IVA group atoms, such as silicon carbide or silicon germanium, or formed of IIIA group atoms and VA group atoms, such as gallium arsenide.

The third doped region 102 is located on the substrate 100. In an embodiment, the third doped region 102 may be, for example, an N-epi layer, a deep N-well region, or a combination thereof.

The well region 114 is located in the third doped region 102. The source region 202 and the fourth doped region 206 are respectively located in the well region 114. Furthermore, a third isolation structure 210 is located between the source region 202 and the fourth doped region 206. The third isolation structure 210 is, for example, a localized thermal oxidation isolation structure. The third isolation structure 210 includes an isolating material such as silicon oxide.

The gate structure 208 includes the gate dielectric layer 208a and a gate electrode 208b. The gate dielectric layer 208a is located between the well region 114 (or the third doped region 102) and the gate electrode 208b. The gate dielectric layer 208a may be constituted by a single material layer. The single material layer is, for example, a low dielectric constant material or a high dielectric constant material. The low dielectric constant material is a dielectric material having a dielectric constant smaller than 4, such as silicon oxide or silicon oxynitride. The high dielectric constant material is a dielectric material having a dielectric constant greater than 4, such as HfAlO, $HfO_2$, $Al_2O_3$, or $Si_3N_4$. A thickness of the gate dielectric layer 208a differs according to choices among different dielectric materials. For example, if the gate dielectric layer 208a is silicon oxide, the thickness of the gate dielectric layer 208a may be 5 nm to 100 nm. The gate electrode 208b is a conductive material, such as metal, undoped polysilicon, doped polysilicon, metal silicide, or a stacking layer combining the foregoing materials.

The JFETs 106 are located in the third doped region 102. Alternately, the third doped region 102 is located between the JFETs 106 and the substrate 100 as shown in FIG. 3A. Each of the JFETs 106 includes the two first doped regions 110a and 110b of the first conductivity type and the drift region 108 of the second conductivity type. In the direction along the line B-B', the drift region 108 is located between the two first doped regions 110a and 110b as shown in FIG. 3A.

The first isolation structures 104 are respectively disposed among the JFETs 106 to separate the JFETs 106 as shown in FIG. 3A. In one embodiment, the first isolation structures 104 may be, for example, shallow trench isolation (STI) structures. Specifically, the first isolation structures 104 may be formed by following steps. First, a plurality of openings (not shown) may be formed in the third doped region 102, for example. Next, an ion irradiation process at a tilted angle is applied to the openings. Then, the first doped regions 110a and 110b may be respectively formed at two sides of the openings through adjusting the tilted angle. In one embodiment, a doping concentration of each of the first doped regions 110a and 110b is $1 \times 10^{17}/c^3$ to $1 \times 10^{19}/cm^3$. But the invention is not limited thereto. In other embodiments, the doping concentrations of the first doped regions 110a and 110b may be adjusted according to requirements of the designer. Thereafter, an insulating material is filled into the opening. The insulating material may be, for example, silicon oxide. In one embodiment, bottom surfaces of the first isolation structures 104 are flush with bottom surfaces of the drift regions 108. But the invention is not limited thereto. In other embodiments, the bottom surfaces of the first isolation structures 104 and the bottom surfaces of the drift regions 108 may also be at different levels.

In addition, the second isolation structure 112 is disposed on the first isolation structures 104 and the JFETs 106. As shown in FIG. 2, the second isolation structure 112 is located between the source region 202 and the drain region 204. Moreover, one portion of the second isolation structure 112 is located in the drift region 108 while another portion of the second isolation structure 112 is located in the third doped region 102, respectively. In other words, the second isolation structure 112 is partially overlapped with the JFETs 106, and a portion of a top surface of the second isolation structure 112 is covered by the gate structure 208. Through an architecture of the gate structure 208 covering one portion of the second isolation structure 112, a position of a maximum intensity of electric field in an electric field formed between the source region 202 and the drain region 204 may therefore be shifted toward a bottom side of the second isolation structure 112, instead of falling beneath the gate dielectric layer 208a. As a result, the architecture prevents the gate dielectric layer 208a with a thinner thickness from being broken through by an overly-strong electric field. In an embodiment, the second isolation structure 112 is, for example, a localized thermal oxidation isolation structure. The second isolation structure 112 includes an isolating material such as silicon oxide.

In an alternative embodiment, a combination of the first isolation structures 104 and the second isolation structure 112 may be viewed as an interdigital structure as shown in FIG. 3A. The first isolation structures 104 are respectively embedded into the third doped region 102, such that the third doped region 102 is divided into a plurality of drift regions 108. In the embodiment, a doping concentration of the third doped region 102 may substantially be equal to a doping concentration of the drift regions 108.

Although the third doped region 102 exists between the first isolation structures 104 and the substrate 100, the invention is not limited thereto. In other embodiments, the first isolation structures 104 may also be connected to or in contact with the substrate 100. In other words, the third doped region 102 may not be required between the first isolation structures 104 and the substrate 100.

Referring back to FIG. 2, the drain region 204 is located in the drift region 108. In an embodiment, the doping concentration of the drift region 108 may be greater than the doping concentration of the third doped region 102, and a doping concentration of the drain region 204 may be greater than the doping concentration of the drift region 108. But the invention is not limited thereto. In other embodiments, the doping concentration of the drift region 108 may be adjusted according to requirements of the designer for reducing the Ron of the semiconductor device 10 provided in the embodiment.

In addition, the semiconductor device 10 further includes a contact 212 disposed on the source region 202. A contact 214 is disposed on the drain region 204. The contact 212 and the contact 214 are respectively conductive materials, such as, metal, undoped polysilicon, doped polysilicon, metal silicide, or a combination thereof.

Figure 3B:
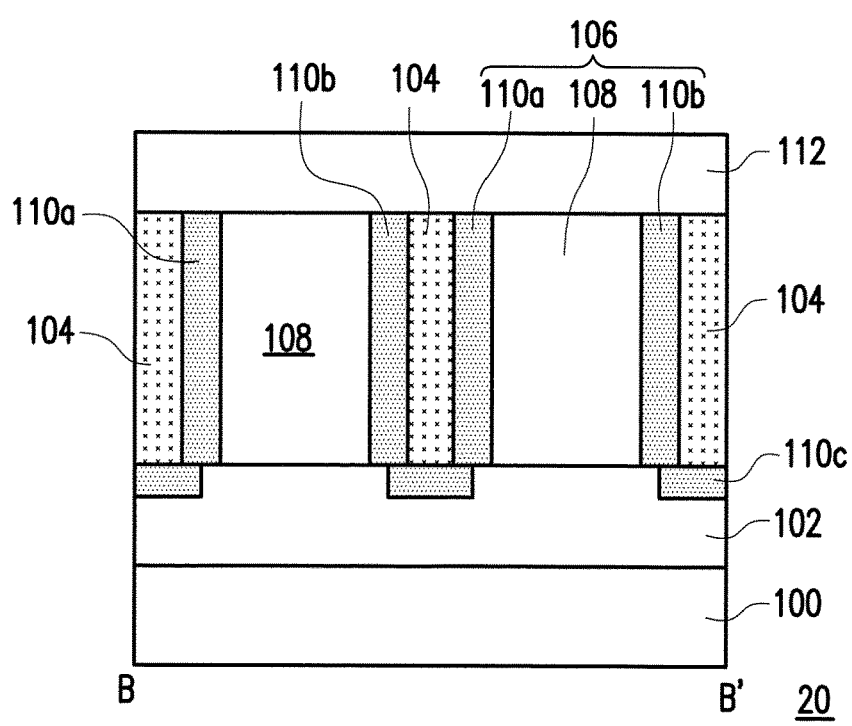
FIG. 3B is a schematic cross-sectional view of the second embodiment taken along the line B-B' in FIG. 1.

FIG. 3B is a schematic cross-sectional view of the second embodiment taken along the line B-B' in FIG. 1.

Referring to FIG. 3B, a semiconductor device 20 in the second embodiment of the invention is similar to the semiconductor device 10 in the first embodiment. Nevertheless, the difference therebetween is that the semiconductor device 20 in the second embodiment further includes a plurality of second doped regions 110c of the first conductivity type respectively disposed in the third doped region 102 below the first isolation structures 104. Specifically, the second doped regions 110c may be formed by following steps. First, a plurality of openings (not shown) are formed in the third doped region 102, for example. Next, an ion irradiation process at a tilted angle is applied to the openings. Then, the first doped regions 110a and 110b may be respectively formed at two sides of the openings through adjusting the tilted angle, and the second doped regions 110c are formed at the bottom of the openings at the same time. In an embodiment, doping concentrations of the first doped regions 110a and 110b and the second doped regions 110c may be substantially identical. But the invention is not limited thereto. In other embodiments, the first doped regions 110a and 110b and the second doped regions 110c may be separately formed, and that the doping concentrations of the first doped regions 110a and 110b and the second doped region 110c are substantially different.

It is worth noting that another type of JFET may be formed by the second doped regions 110c, the third doped region 102, and the substrate 100. When the drain voltage is high, since the JFET formed by the second doped regions 110c, the third doped region 102, and the substrate 100 is also equipped with the pinch-off effect, a breakdown voltage of the semiconductor device 20 provided by the embodiment is further increased.

In view of the forgoing, in the embodiments of the invention, a plurality of JFETs connected in parallel are connected with the MOSFET in series. When a drain voltage is low, the Ron of the semiconductor device provided by the embodiments of the invention acts as a parallel resistance of the JFETs. But when the drain voltage is high, since the pinch-off effect in the JFETs shares most of the voltage drop, the breakdown voltage of the semiconductor device provided by the embodiments of the invention is increased. It is thus can be seen that the semiconductor device of the invention is not only equipped with a high breakdown voltage but also able to maintain a low Ron at the same time.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor device, comprising:
    a metal-oxide-semiconductor field-effect transistor (MOSFET), disposed on a substrate, wherein the MOSFET comprises a source region, a drain region, and a gate structure disposed between the source region and the drain region;
    a plurality of junction gate field-effect transistors (JFETs) connected in parallel, being connected with the MOSFET in series, wherein each of the JFETs laterally extends between the source region and the drain region; and
    a plurality of first isolation structures, respectively disposed among the JFETs, wherein each of the first isolation structures laterally extends between the source region and the drain region.

2. The semiconductor device as claimed in claim 1, wherein each of the JFETs comprises:
    two first doped regions of a first conductivity type, located on the substrate; and
    a drift region of a second conductivity type, disposed between the two first doped regions.

3. The semiconductor device as claimed in claim 2, further comprising a plurality of the second doped regions of the first conductivity type, and the second doped regions being disposed respectively below the first isolation structures.

4. The semiconductor device as claimed in claim 1, wherein the first isolation structures and the gate structure are separated by a distance.

5. The semiconductor device as claimed in claim 1, further comprising a second isolation structure, disposed on the first isolation structures and the JFETs, wherein the gate structure partially covers a top surface of the second isolation structure.

6. The semiconductor device as claimed in claim 1, further comprising a third doped region of a second conductivity type, and the third doped region being located between the substrate and the JFETs.

7. A semiconductor device, comprising:
    a substrate of a first conductivity type;
    a source region of a second conductivity type and a drain region of the second conductivity type, respectively disposed on the substrate;
    a gate structure, disposed on the substrate between the source region and the drain region;
    a drift region of the second conductivity type, disposed between the substrate and the gate structure;
    a plurality of first isolation structures, respectively disposed in the first drift region, such that the first drift region is divided into a plurality of second drift regions, wherein each of the second drift regions laterally extends between the source region and the drain region; and
    a plurality of first doped regions of the first conductivity type, respectively disposed between the first isolation structures and the second drift regions.

8. The semiconductor device as claimed in claim 7, further comprising a third doped region of the second conductivity type, located between the substrate and the first isolation structures.

9. The semiconductor device as claimed in claim 8, further comprising a plurality of second doped regions of the first conductivity type, disposed respectively in the third doped region below the first isolation structures.

* * * * *